United States Patent
Boissiere

(10) Patent No.: US 12,194,877 B2
(45) Date of Patent: Jan. 14, 2025

(54) AC/DC CONVERTER WITH POWER FACTOR CORRECTION AND METHOD FOR CALIBRATING SUCH A CONVERTER

(71) Applicant: VITESCO TECHNOLOGIES GMBH, Regensburg (DE)

(72) Inventor: Philippe Boissiere, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 221 days.

(21) Appl. No.: 17/914,248

(22) PCT Filed: Mar. 22, 2021

(86) PCT No.: PCT/EP2021/057264
§ 371 (c)(1),
(2) Date: Sep. 23, 2022

(87) PCT Pub. No.: WO2021/191145
PCT Pub. Date: Sep. 30, 2021

(65) Prior Publication Data
US 2023/0114387 A1 Apr. 13, 2023

(30) Foreign Application Priority Data
Mar. 24, 2020 (FR) ...................... 2002830

(51) Int. Cl.
*G01R 35/00* (2006.01)
*B60L 53/30* (2019.01)
(Continued)

(52) U.S. Cl.
CPC ............... *B60L 53/62* (2019.02); *B60L 53/30* (2019.02); *G01R 19/0084* (2013.01);
(Continued)

(58) Field of Classification Search
CPC ...... B60L 53/62; B60L 53/30; B60L 2210/10; B60L 2210/30; H02M 1/0025;
(Continued)

(56) References Cited

U.S. PATENT DOCUMENTS 8,937,826 B2 * 1/2015 Yuan ........................ G05F 1/70
363/89
2012/0091970 A1 4/2012 Cho et al.
(Continued)

FOREIGN PATENT DOCUMENTS

| CN | 106291397 A | 1/2017 |
|---|---|---|
| CN | 106849708 A | 6/2017 |

(Continued)

OTHER PUBLICATIONS

International Search Report and Written Opinion of the ISA for PCT/EP2021/057264 dated Jul. 9, 2021, 10 pages.

*Primary Examiner* — Gary L Laxton
(74) *Attorney, Agent, or Firm* — NIXON & VANDERHYE

(57) ABSTRACT

Disclosed is a method for calibrating an AC/DC converter with power factor correction, including the following steps: —connecting the input connector of the converter to a predetermined DC voltage power supply, such that this predetermined DC voltage is applied between the terminals of the input connector; —measuring, with a voltage measuring unit, the resulting calibration DC voltage which is delivered by the switching module when the predetermined DC voltage is applied between the terminals of the input (Continued)

connector; and —calibrating the voltage measuring unit by performing a calibration bringing the resulting calibration voltage back to the level of the predetermined DC voltage.

20 Claims, 1 Drawing Sheet

(51) Int. Cl.
*B60L 53/62* (2019.01)
*G01R 19/00* (2006.01)
*H02J 7/00* (2006.01)
*H02J 7/02* (2016.01)
*H02M 1/00* (2006.01)
*H02M 1/42* (2007.01)

(52) U.S. Cl.
CPC .......... *G01R 35/005* (2013.01); *H02J 7/0042* (2013.01); *H02J 7/02* (2013.01); *H02M 1/0025* (2021.05); *H02M 1/4208* (2013.01); *B60L 2210/10* (2013.01); *B60L 2210/30* (2013.01); *H02J 2207/20* (2020.01)

(58) Field of Classification Search
CPC ............. H02M 1/4208; G01R 19/0084; G01R 35/005; H02J 7/0042; H02J 7/02; H02J 2207/20
See application file for complete search history.

(56) References Cited

U.S. PATENT DOCUMENTS

| 2013/0121047 | A1* | 5/2013 | Lin | ............... | H02M 1/4225 363/84 |
| 2014/0052394 | A1* | 2/2014 | Sun | ............... | G01R 35/005 702/61 |
| 2021/0408899 | A1* | 12/2021 | Dai | ............... | H02M 1/44 |

FOREIGN PATENT DOCUMENTS

| CN | 106291397 B | 12/2018 |
| CN | 106849708 B | 7/2019 |
| EP | 1 324 476 | 7/2003 |

* cited by examiner

AC/DC CONVERTER WITH POWER FACTOR CORRECTION AND METHOD FOR CALIBRATING SUCH A CONVERTER

CROSS-REFERENCE TO RELATED APPLICATIONS

This application is the U.S. national phase of International Application No. PCT/EP2021/057264 filed Mar. 22, 2021 which designated the U.S. and claims priority to French Patent Application No. 2002830 filed Mar. 24, 2020, the entire contents of each of which are hereby incorporated by reference.

BACKGROUND OF THE INVENTION

Field of the Invention

The invention relates to AC/DC converters with power factor correction such as those used in charging electric vehicles.

Description of the Related Art

AC/DC converters with power factor correction are commonly used in many applications. These converters are also called "reactive power compensation converters" or PFC (Power Factor Correction) converters.

These converters are intended to be connected to the AC electricity grid and deliver a DC voltage at output. These converters are provided to absorb a sinusoidal current, in particular to contribute to the stability of the electricity grid. An AC/DC converter with power factor correction thus has a power factor close to unity and therefore behaves, from the point of view of the stability of the electricity grid, like a resistor. These AC/DC converters are generally imposed by regulations, in particular for high-power applications.

For example, in the case of electric vehicles, if numerous vehicles are connected to the electricity grid at the same time in order to recharge their traction batteries, the electricity grid may be destabilized and phenomena such as voltage drops may be amplified. Electric vehicle chargers must thus be imperatively equipped with AC/DC converters with power factor correction.

A conventional electric-vehicle on-board charger generally comprises an AC/DC converter with power factor correction which is connected to the electricity grid at input and which is connected, at output, to a DC/DC converter which is controlled according to the charging needs of the battery that is to be recharged. The AC/DC converter generally supplies the DC/DC converter with a DC voltage of around 400 volts.

For the function of power factor correction, the AC/DC converter must be dimensioned to deliver a DC voltage that is adapted to the voltage of the AC electricity grid.

Specifically, the DC voltage delivered by the converter must be greater than the peak voltage of the grid, that is to say the maximum voltage that may be observed on this grid.

Furthermore, the DC voltage delivered by the AC/DC converter generally has, in reality, a wave profile due to the imperfection of the components.

The output voltage of the AC/DC converter must therefore be accurately regulated, since:
  if it is too low (less than the peak voltage of the AC electricity grid), sinusoidal absorption, and therefore power factor correction, may no longer be ensured;
  if it is too high, the maximum supported voltage specifications of some power components may be exceeded.

Furthermore, the AC/DC converter generally comprises a control module which comprises a means of measuring the delivered voltage, and also a device for servo controlling the DC voltage delivered by the switching module. However, the accuracy of the regulation of the output voltage of the AC/DC converter is dependent on the accuracy of the voltage-measuring components and of the components of the servo-control device.

Solutions have been envisaged for regulating the output voltage of the AC/DC converter between its high and low limits.

The electronic components constituting the servo-control device and the voltage measuring means of the control module may be chosen from high-end components that are more accurate and that reduce output voltage regulation uncertainty. These components are expensive compared to conventional components, which is not compatible with the need to reduce costs that is inherent in mass industrial production such as in the automotive sector.

It may also be envisaged to choose components with a higher voltage withstand (for example 1000 volts) to constitute the AC/DC converter, in order to raise the high voltage threshold that is not to be exceeded. The output DC voltage of the converter then no longer presents the risk of exceeding the upper voltage threshold, even with ripples and uncertainties in the voltage servo control. These components which have a higher voltage withstand are larger, more expensive and are less accurate than components which have a voltage withstand that is barely greater than 400 volts.

It is also possible in certain applications to proceed with adjustments during manufacture of the AC/DC converter by measuring, using external diagnostic means, the output behavior of the output voltage of the converter, using oscilloscopes, laboratory measuring means designed to accurately measure voltages, etc. These solutions are applicable in a laboratory context but are however incompatible with mass production. Production lines are subject to regulations which generally prohibit access to live electrical parts, for the safety of the operators. For example, in the case of a production line for motor vehicles that are equipped with on-board battery chargers, the chargers will be fully assembled beforehand, by connecting their AC/DC converter to the DC/DC converter, without any element being live. The charger and the connections to the batteries are all protected in secure housings, and they may only be powered up when no live parts are accessible. No adjustment requiring access to live parts may therefore be implemented in such a context.

SUMMARY OF THE INVENTION

The aim of the invention is to improve the AC/DC converters of the prior art.

To this end, the invention relates to a method for calibrating an AC/DC converter with power factor correction, this converter comprising:
  an input connector comprising at least two power supply terminals for connecting the converter to the AC electricity grid;
  a switching module comprising power switches, which is designed to deliver a DC voltage from a sinusoidal voltage applied to the input connector;
  a control module designed to control the power switches of the switching module, this control module comprising: a voltage measuring means designed to measure the DC voltage delivered by the switching module; and
a device for servo controlling the DC voltage delivered by the switching module;
this method comprising the following steps:
connecting the input connector to a predetermined DC voltage power supply, such that this predetermined DC voltage is applied between the terminals of the input connector;
measuring, with the voltage measuring means, the resulting calibration DC voltage which is delivered by the switching module when the predetermined DC voltage is applied between the terminals of the input connector;
calibrating the voltage measuring means by performing a calibration bringing the resulting calibration voltage back to the level of the predetermined DC voltage.

Another subject of the invention relates to an AC/DC converter with power factor correction such as described above and in which the switching module comprises two modes:
a nominal mode of operation in which the input connector is connected to the AC electricity grid and the servo-control device proceeds with the servo control, at a setpoint voltage, of the DC voltage delivered by the switching module;
a calibration mode in which the input connector is connected to a predetermined DC voltage power supply, and the voltage measuring means is calibrated by a calibration bringing the resulting voltage delivered by the switching module back to the level of the predetermined DC voltage.

According to one embodiment, the control module comprises a microcontroller constituting the servo-control device and the voltage measuring means, the microcontroller being programmed to switch from the nominal mode of operation to the calibration mode.

Such an AC/DC converter and its calibration method allow the conversion of the AC voltage from the electricity grid into a DC voltage that is accurately regulated and calibrated such that it is: high enough to allow absorption of a sinusoidal current and therefore, to allow power factor correction of the converter; and low enough to remain below the voltage withstand of the conventional components constituting the converter.

The invention thus allows the use of standard components which are inexpensive and of high accuracy for the production of these converters. This is compatible with the cost standards of mass production such as in the automotive industry.

Furthermore, the method for calibrating the converter may be implemented in an industrial production environment and complies with the safety regulations in force in production plants because the calibration operation is performed at the end of the line, within the converter itself, without any intervention from external equipment, or any need to access live parts. At no time do operators have access to the high DC voltage delivered by the converter.

The calibration method according to the invention may comprise the following additional features, alone or in combination:
the servo-control device is designed to servo control, at a setpoint voltage, the DC voltage delivered by the switching module;
the predetermined DC voltage is substantially equal to the setpoint voltage;
the setpoint voltage is greater than the maximum peak voltage of the AC electricity grid for which the input connector is provided;
the DC power supply of predetermined voltage has an accuracy greater than the accuracy of the voltage measuring means;
the DC power supply of predetermined voltage has an accuracy of better than +1%.

The battery charger according to the invention may comprise the following additional features, alone or in combination:
the battery charger further comprises a DC/DC converter designed for charging batteries, the DC voltage delivered at the output of the AC/DC converter being connected to the input of the DC/DC converter;
the battery charger comprises a closed housing that prevents access to the connection between the output of the AC/DC converter and the input of the DC/DC converter.

BRIEF DESCRIPTION OF THE DRAWINGS

Other features and advantages of the invention will become apparent from the following non-limiting description, with reference to the appended drawings, in which.

DESCRIPTION OF THE PREFERRED EMBODIMENTS

Figure 1:
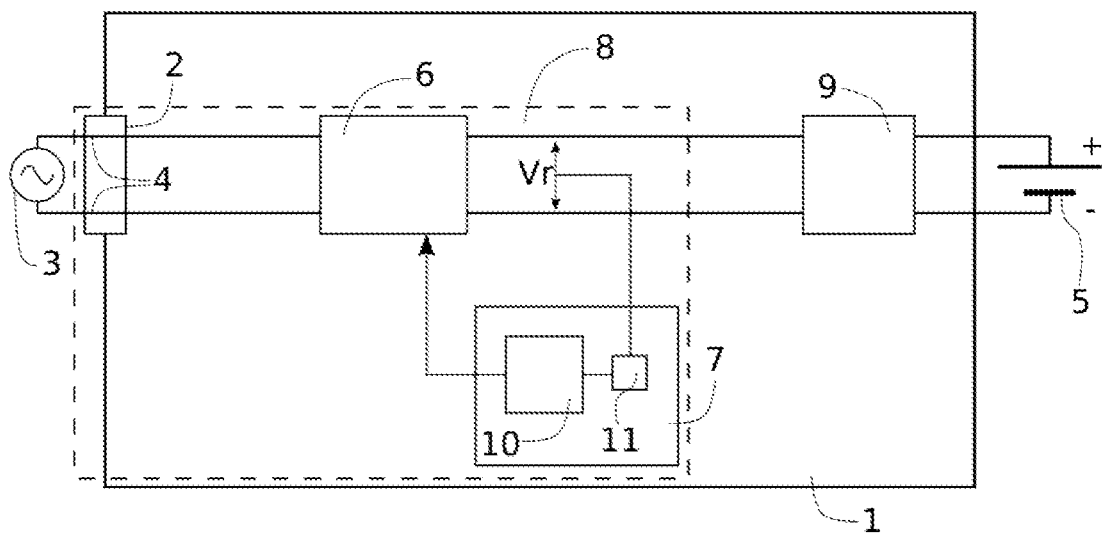
FIG. 1 schematically shows a battery charger comprising an AC/DC converter according to the invention.
Figure 2:
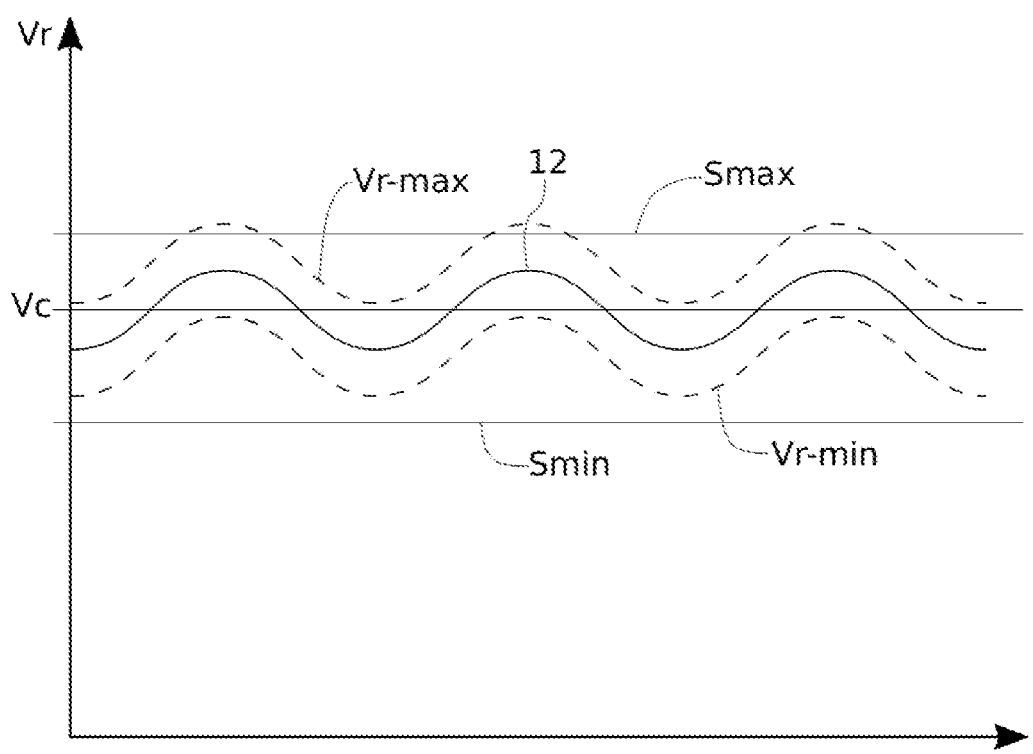
FIG. 2 illustrates the output voltage of the converter of FIG. 1.

FIGS. 1 and 2 relate to an on-board battery charger in an electric vehicle, and illustrate one exemplary implementation of the AC/DC converter according to the invention.

FIG. 1 schematically shows an on-board charger 1 in the electric vehicle, which charger is designed for charging the traction batteries of this electric vehicle by connecting it to the AC electricity grid. Specifically, electric vehicles generally have two possibilities for charging their traction batteries: an external charging terminal comprising its own high-power charger; or an on-board charger such as that of FIG. 1 which makes it possible to charge the electric vehicle on a domestic power outlet.

The on-board charger of FIG. 1 is intended to be connected to the AC electricity grid like any other electrical appliance and must therefore comply with the standards and regulations in force with regard to the grid. In particular, the charger 1 comprises means for controlling the absorbed current for the purpose of promoting the stability of the electricity grid to which it is connected.

The charger 1 comprises an input connector 2 which is designed to be connected to a domestic power outlet for connection to the AC electricity grid 3. In the present example, the charger 1 is a single-phase charger and the connector 2 thus comprises two power supply terminals 4 for the phase and the neutral (in addition to the protective conductor, not shown).

The output of the charger 1 is connected to the traction batteries of the vehicle, which are represented schematically by the generator 5.

The function of the battery charger 1 is to receive electrical energy from the AC grid 3 at the input and to apply at the output a DC voltage across the terminals of the batteries 5, this voltage being controlled in a known manner as a function of the charging cycle of the batteries 5.

The charger 1 comprises here an AC/DC converter 8 and a DC/DC converter 9. The AC/DC converter 8 has the function of converting the AC voltage from the grid into a fixed DC voltage, the value of which is 400 volts in the present example. The AC/DC converter 8 delivers this DC voltage to the DC/DC converter 9 which will intelligently control the charging of the batteries 5 while supplying a DC voltage to the batteries 5, this voltage adapting to the needs of the batteries 5 as a function of the charging cycle. The DC/DC converters 9 designed to control the charging cycles of the batteries are known and will not be described in more detail here.

The AC/DC converter 8 comprises at input the connector 2, a switching module 6 and a control module 7.

The switching module 6 comprises, in a known manner, a rectifier assembly, as well as switching means linked to coils and capacitors, making it possible to generate a DC voltage. The switching means are generally constituted by a bridge of power switches such as power MOSFET or IGBT transistors.

The switching module 6 is controlled by the control module 7.

In practice, the control module 7 is here constituted of a microcontroller which is connected to the grid of power switches of the switching module 6 and is designed to open or close the power switches according to a program.

Within the control module 7, the microcontroller and its programs are arranged to constitute in particular a servo-control device 10 and a voltage measuring means 11. The voltage measuring means 11 may be constituted by any known means that ensures the function as a voltmeter and that makes it possible to measure the voltage present across the output terminals of the switching module 6.

This information on the voltage value across the output terminals of the switching module 6 is made available to the servo-control device 10, which controls the power switches of the switching module 6 so as to adjust the switching in such a way that the output voltage of the switching module 6 is equal to a setpoint value, which here is 400 volts.

In a known manner, the AC/DC converter 8 is a converter with power factor correction and the control module 7 controls the power switches of the switching module 6 accordingly.

FIG. 2 is a curve illustrating the profile of the voltage Umc across the output terminals of the switching module 6, and therefore at the output of the AC/DC converter 8, as a function of time. This voltage Umc is therefore the voltage delivered by the AC/DC converter 8.

The setpoint voltage Vc, which here is 400 volts, is represented in FIG. 2 by a straight horizontal line, this line corresponding to the setpoint voltage for the servo-control device 10.

Taking into account the constraints related to the nature of common electronic components, the real voltage at the output of the AC/DC converter is a voltage which oscillates either side of this setpoint voltage Vc. Furthermore, manufacturing tolerances of the electronic components lead to an uncertainty on the servo control of this voltage which, instead of oscillating exactly like the solid-line curve 12, oscillates somewhere between the uncertainty curves Vr-min and Vr-max (dashed in FIG. 2).

The gap between the two curves Vr-min and Vr-max corresponds here to the uncertainty generated by the error range of the voltage measuring means 11. For example, an error range of 5% corresponds to +20 V for a voltage of 400 V.

FIG. 2 also shows two thresholds embodied by a straight horizontal line Smin and Smax. The threshold Smin corresponds to the minimum threshold below which the voltage Umc must not drop in order for the AC/DC converter 8 to be able to fulfill its function of power factor correction, and the threshold Smax corresponds to the voltage withstand threshold of the electronic components.

For example, in a country where the RMS grid voltage is 230 V with a tolerance of 15%, the maximum peak voltage will be (230 V+15%)×√2, that is to say 375 V. The DC voltage at the output of the AC/DC converter must therefore be greater than 375 volts in order for the function of power factor correction to be ensured. The threshold Smin is therefore fixed at 375 V in this example.

The threshold Smax is, for example, 440 volts in this example. Components with such a voltage threshold are common, inexpensive and accurate components.

In the prior art, taking into account the thresholds Smin and Smax led to raising the setpoint voltage Vc, for example to a value of around 410 to 420 volts, so as to guarantee that the low uncertainty curve Vr-min is above the threshold S-min. This led to the possibility of the high uncertainty curve Vr-max exceeding the threshold Smax, reaching, in critical cases, 450 volts, and therefore damaging the components (this is the case illustrated in FIG. 2 where the high uncertainty curve Vr-max may exceed the threshold Smax).

The invention makes it possible to overcome the uncertainty limits Vr-max and Vr-min by positioning the curve 12 of the voltage Umc as accurately as possible such that it is systematically positioned between the thresholds Smin and Smax.

To this end, at the end of production of an AC/DC converter 8, or of the complete charger 1, a method for calibrating the AC/DC converter 8 is implemented.

In a context of mass production in a factory, these operations will preferably be performed when the assembly of the charger 1 and its connection to the batteries 5 have been completed, with in particular covers and safety locks preventing operator access to voltages that present a risk of electrocution, the connection between the output of the AC/DC converter 8 and the input of the DC/DC converter 9 being in particular inaccessible.

The calibration method starts by connecting the input connector 2 to an accurate DC power supply making up part of the production line. This power supply delivers a predetermined DC voltage between the power supply terminals 4. This step is a counter-intuitive use of the input connector 2, which is normally provided for the AC electricity grid, but this step is performed in a context of production, outside of its recommended use for the end user.

The predetermined DC voltage may be any voltage whose value is known to a satisfactory degree of accuracy. This satisfactory degree of accuracy must in particular be greater than the accuracy of the measuring means 11, for example an accuracy of better than +1%. Preferably, the predetermined DC voltage is close to the setpoint voltage Vc, or even equal to this setpoint voltage Vc. In the present example, this predetermined DC voltage is 400 volts and is applied across the power supply terminals 4 by a power supply whose accuracy is 400 V+0.2%, which is a common accuracy for a laboratory power supply.

During this first step, the power switches of the switching module are not activated because the voltage at the input of the converter is, unlike its normal operation, already DC. The predetermined DC voltage is found in the exact same way across the output terminals of the AC/DC converter 8, except that it is influenced by the electronic components that are present in the switching module 6 with their manufacturing and assembly tolerance.

During a second step, the voltage present across the output terminals of the converter 8 by virtue of the measuring means 11, this voltage being called resulting calibration voltage Vr. The voltage Vr corresponds to the voltage which is effectively present at the output of the switching module 6, when the predetermined DC voltage is applied at the input. The resulting voltage Vr would be equal to the predetermined DC voltage if the assembly was perfect. In the actual assembly, the measured resulting voltage Vr will be different from the predetermined DC voltage and will encompass the measurement error specific to the voltage measuring means 11, taking into account its accuracy.

For the example, it will be assumed that:
the predetermined DC voltage is 400 volts;
the measured resulting voltage Vr is 405 volts.

Taking into account the difference between 405 V and 400 V will make it possible to calibrate the converter 8 so as to ensure the correct positioning of the curve 12 (FIG. 2) of this particular converter, between the thresholds Smin and Smax.

During a third step, the AC/DC converter 8 is calibrated by calibrating only the voltage measuring means 11. The voltage measuring means is calibrated by modifying its calibration such that the currently measured resulting voltage Vr (405 V in the example) corresponds to the predetermined DC voltage (400 V in the example). In other words, the calibration of the voltage measuring means will cause the latter to indicate a voltage equal to the predetermined DC voltage (400 V in the example) when it is in the presence of a voltage equal to Vr (405 V in the example).

Within the voltage measuring means 11, the resulting voltage Vr is thus calibrated to the level of the predetermined DC voltage (the resulting voltage Vr is brought back to the level of the predetermined DC voltage, from the point of view of the voltage measuring means).

The voltage measuring means 11 will be deliberately deregulated so as to cause it to measure a value equal to the predetermined DC voltage while it is in the presence of the resulting calibration voltage Vr (which would be the case if the components were perfect).

According to the example mentioned above, after calibration, when the voltage measuring means 11 is in the presence of a voltage of 405 volts, it will deliver information to the control module 7, according to which information the measured voltage is 400 volts.

The calibration of the voltage measuring means 11 therefore causes the latter to give voltage values to the servo-control device 10 which are false in absolute terms, but this will lead the servo control to proceed in the same way and to produce a curve 12 of the same profile, but whose positioning in height will be different because the setpoint voltage Vc will be better centered. Thus, regardless of the positioning of the curve 12 before the calibration, this curve is re-centered by the calibration between the two extreme thresholds Smin and Smax. The setpoint voltage, and therefore the gap between the uncertainty curves Vr-min and Vr-max, is thus also centered between the two extreme thresholds Smin and Smax, such that there is no risk of crossing one of these thresholds.

The calibration method is concluded by storing this calibration of the voltage measuring means 11 in the microcontroller, a calibration which could be kept for the entire lifetime of the charger 1.

However, during maintenance phases, it is also possible to implement this calibration method again so as to re-center the setpoint Vc again between the thresholds Smin and Smax, in response to a drift of the components related for example to the aging of these components.

To implement the method that has just been described, the control module 7 comprises at least the following two modes:

a nominal mode of operation in which the input connector 2 is connected to the AC electricity grid and the servo-control device 10 proceeds with the servo control, at a setpoint voltage Vc, of the DC voltage delivered by the switching module 6;

a calibration mode in which the input connector 2 is connected to a predetermined DC voltage power supply, and the voltage measuring means 11 is calibrated by a calibration bringing the resulting voltage delivered by the switching module 6 back to the level of the predetermined DC voltage.

These modes can be programmed in a microcontroller constituting the control module 7, the microcontroller being programmed to switch from the nominal mode of operation to the calibration mode by an external command or when the connection to a power supply delivering the predetermined DC voltage is detected.

Variant embodiments may be implemented without departing from the scope of the invention. For example, the charger 1 may be provided for the three-phase grid, the input connector 2 then comprising four phases.

The invention claimed is:

1. A method for calibrating an AC/DC converter with power factor correction, the AC/DC converter including
an input connector including at least two power supply terminals configured to connect the AC/DC converter to an AC electricity grid,
a switching system including power switches, the switching system being configured to deliver a DC voltage from a sinusoidal voltage applied to the input connector,
a controller configured to control the power switches of the switching system, the controller including a voltage measurement system configured to measure the DC voltage delivered by the switching system, and
a servo-control device configured to servo control the DC voltage delivered by the switching system,
the method comprising:
connecting the input connector to a predetermined DC voltage power supply, such that the predetermined DC voltage is applied between the terminals of the input connector;
obtaining a resulting calibration DC voltage delivered by the switching system when the predetermined DC voltage is applied between the terminals of the input connector;
measuring, with the voltage measurement system, the resulting calibration DC voltage; and
calibrating the voltage measurement system by performing a calibration bringing the resulting calibration DC voltage back to a level of the predetermined DC voltage.

2. The method as claimed in claim 1, wherein the DC power supply of predetermined voltage has an accuracy greater than an accuracy of the voltage measurement system.

3. The method as claimed in claim 2, wherein the accuracy of the DC power supply of predetermined voltage is better than ±1%.

4. The method as claimed in claim 1, wherein the servo-control device is configured to servo control, at a setpoint voltage, the DC voltage delivered by the switching system.

5. The method as claimed in claim 4, wherein the predetermined DC voltage is substantially equal to the setpoint voltage.

6. The method as claimed in claim 5, wherein the setpoint voltage is greater than a maximum peak voltage of the AC electricity grid for which the input connector is provided.

7. The method as claimed in claim 6, wherein the DC power supply of predetermined voltage has an accuracy greater than an accuracy of the voltage measurement system.

8. The method as claimed in claim 5, wherein the DC power supply of predetermined voltage has an accuracy greater than an accuracy of the voltage measurement system.

9. The method as claimed in claim 8, wherein the accuracy of the DC power supply of predetermined voltage is better than ±1%.

10. The method as claimed in claim 4, wherein the setpoint voltage is greater than a maximum peak voltage of the AC electricity grid for which the input connector is provided.

11. The method as claimed in claim 10, wherein the DC power supply of predetermined voltage has an accuracy greater than an accuracy of the voltage measurement system.

12. The method as claimed in claim 11, wherein the accuracy of the DC power supply of predetermined voltage is better than ±1%.

13. The method as claimed in claim 4, wherein the DC power supply of predetermined voltage has an accuracy greater than an accuracy of the voltage measurement system.

14. The method as claimed in claim 13, wherein the accuracy of the DC power supply of predetermined voltage is better than ±1%.

15. An AC/DC converter with power factor correction, the AC/DC converter comprising:
   an input connector comprising at least two power supply terminals configured to connect the AC/DC converter to an AC electricity grid;
   a switching system comprising power switches, the switching system being configured to deliver a DC voltage from a sinusoidal voltage applied to the input connector; and
   a controller configured to control the power switches of the switching module, this the controller comprising:
      a voltage measurement system configured to measure the DC voltage delivered by the switching module, and
      a servo-control device configured to servo control the DC voltage delivered by the switching system;
   wherein the switching system comprises two modes:
      a nominal mode of operation in which the input connector is connected to the AC electricity grid and the servo-control device proceeds with the servo control, at a setpoint voltage, of the DC voltage delivered by the switching system, and
      a calibration mode in which the input connector is connected to a predetermined DC voltage power and the voltage measurement system supply, is calibrated by a calibration bringing a resulting voltage delivered by the switching system back to a level of the predetermined DC voltage.

16. The converter as claimed in claim 15, wherein the controller comprises a microcontroller constituting the servo-control device and the voltage measurement system, the microcontroller being programmed to switch from the nominal mode of operation to the calibration mode.

17. A battery charger comprising:
   the AC/DC converter as claimed in claim 8; and
   a DC/DC converter configured to charge batteries, the DC voltage delivered at an output of the AC/DC converter being connected to an input of the DC/DC converter.

18. The battery charger as claimed in claim 17, further comprising a closed housing that prevents access to a connection between the output of the AC/DC converter and the input of the DC/DC converter.

19. A battery charger comprising:
   the AC/DC converter as claimed in claim 15; and
   a DC/DC converter configured to charge batteries, the DC voltage delivered at an output of the AC/DC converter being connected to an input of the DC/DC converter.

20. The battery charger as claimed in claim 19, further comprising a closed housing that prevents access to a connection between the output of the AC/DC converter and the input of the DC/DC converter.

* * * * *